(12) United States Patent
Hamazawa

(10) Patent No.: US 6,264,167 B1
(45) Date of Patent: Jul. 24, 2001

(54) SEMICONDUCTOR DEVICE

(75) Inventor: Yasushi Hamazawa, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 09/478,811

(22) Filed: Jan. 7, 2000

(30) Foreign Application Priority Data

Jan. 12, 1999 (JP) .................................. 11-005679

(51) Int. Cl.$^7$ .................................................. H01L 29/72
(52) U.S. Cl. ........................ 251/288; 257/328; 257/401; 257/408
(58) Field of Search ........................... 257/288, 328, 257/401, 408

(56) References Cited

U.S. PATENT DOCUMENTS 5,744,826 * 4/1998 Takeuchi et al. ................. 257/328

* cited by examiner

Primary Examiner—Edward Wojciechowicz
(74) Attorney, Agent, or Firm—Arent Fox Kintner Plotkin & Kahn, PLLC

(57) ABSTRACT

On the surface of an n-type semiconductor layer as a drain region (1), a plurality of body regions (2) formed by p-type diffusion regions are formed regularly. And within each of the body regions (2), an n-type source region (3) is formed with a certain interval from the periphery, and a gate electrode (5) is provided through a gate oxide film (4) on the surface of a channel region (8) between the source region (3) and the drain region (1), and a drain electrode (7) is formed through a contact region (9) on the drain region (drain cell) (1) surrounded by the plurality of body regions (2). And the body region (2) is formed as an octagon on the plane, and the drain cell (1) is formed as a quadrilateral on the plane. As a result, a semiconductor device is obtained which has a lateral DMOS with an increased gate width per unit area that can increase the withstand voltage.

6 Claims, 2 Drawing Sheets

SEMICONDUCTOR DEVICE

FIELD OF THE INVENTION

The present invention relates to a semiconductor device having a double diffusion MOSFET, more particularly to a semiconductor device which has a lateral type double diffusion MOSFET available for integrated circuit devices wherein each cell has its drain electrode taken out from the top.

BACKGROUND OF THE INVENTION

A double diffusion MOSFET (hereinafter referred to as a DMOS) is applied widely for power IC's or motor drivers because it can withstand high voltage compared to an ordinal MOSFET and because of its comparatively low on-resistance (operating resistance) $R_{on}$.

For this type of MOSFET, one of the important characteristics together with the withstand voltage is the operating resistance, and particularly a lower on-resistance (operating resistance) $R_{on}$ has been required for recent electrical apparatuses wherein a low power consumption is desired. In general, to reduce $R_{on}$, not to speak of optimizing the device configuration, the optimization of manufacturing conditions is important. In case those conditions are optimized, however, by changing the gate width of the DMOS, the operating resistance $R_{on}$ is adjusted. That is to say, by broadening the gate width, $R_{on}$ can be made smaller, and if the gate width becomes twice as wide, then $R_{on}$ becomes a half, and if the gate width is tripled, then the $R_{on}$ becomes one third. When the gate width is widened, however, the chip area becomes larger in general and the cost for that is increased. Therefore, it has become a problem to be solved to broaden the gate width without increasing the chip area.

Gate patterns for each cell of conventional DMOSFET are shown in FIGS. 3(a) to 3(e). And in each of the FIGS., an S stands for a source contact part and a D stands for a drain contact part, respectively.

In FIG. 3(a), an orthodox design called a stripe type gate is shown, of which gate width is not wide enough per unit area. Because of the simple design, however, it is easy for a layout and widely used.

The structure shown in FIG. 3(b) is a design called a mesh type gate, and if it is processed with the same vertical structure and the process precision as the stripe type structure in FIG. 3(a), it is possible for the gate width per unit area to be 1.15 times as large as that of the stripe type structure. This mesh type structure is widely known and is actually utilized. However, because of the corner part C which bends 90 degrees, the withstand voltage is somewhat lowered and side wall spacers formed on the poly-silicon wall of the gate or the like are different in the linear parts and in the corner parts, which serves as demerits.

The structure shown in FIG. 3(c) is a honeycomb type gate, and the gate width per unit area is 1.18 times as large as that of the stripe type, but this is originally designed to be used for the vertical type DMOS structure (the whole parts of this pattern are used as a source and a drain is taken out from the backside of the substrate in this structure), therefore, if they are used as sources S and drains D for alternate lines as shown in the Figure, a non working area shown as A in FIG. 3(c) exists (the source and the drain are too far away and the area in between can not be utilized as a channel), the effective gate width becomes 0.82 times as large as that of the stripe type, which does not have any merits in the lateral type DMOS.

The structure shown in FIG. 3(d) has a form where the mesh type and the honeycomb type are combined. In this structure, the gate width per unit area is 1.1 times as large as that of the stripe type, the distance between the source contact to the gate is locally long (See B), which is a demerit for allowing a parasitic npn transistor to operate easily.

FIG. 3(e) shows a circular gate, of which gate width per unit area is 1.6 times as large as that of the stripe type and since it does not have a corner part, the structure does not have a difficulty with controlling the withstand voltage or the vertical structure while being under construction.

However, since it has a non working area A and there is a part where the drain area is pinched (the portion of E), it can not be said to be the best form.

As described above, each of the conventional gate structures has merits and demerits, and accompanying the miniaturization of electric apparatuses for the portability, it is required to further reduce the power consumption and is required to have a DMOS of a wider gate width in the same chip area.

SUMMARY OF THE INVENTION

In review of the above mentioned situation, it is a purpose of the present invention to provide a semiconductor device having a lateral type DMOS which can increase the gate width per unit area and can increase withstand voltage.

A semiconductor device according o the present invention has a lateral type double diffusion MOSFET comprising: a semiconductor layer of a first conductivity type as a drain region; a plurality of body regions comprising a plurality of diffusion regions of a second conductivity type formed regularly on a surface of the semiconductor layer; source regions of the first conductivity type, each of which being formed within each of the plurality of body regions with a certain interval from the periphery; gate electrodes formed through an insulator film on the surface of channel regions between the source regions and the drain region; and drain cells, each of which being surrounded by some of the plurality of body regions and is provided with a contact region for an electrode, wherein the body regions being formed as an octagon on a plane, and the drain cells being formed as a quadrilateral on the plane.

More concretely, it has a structure where, the octagon of the body regions have long sides and short sides connected alternately on the plane, the short sides being formed by cutting off the corners of a quadrilateral, and the body regions and the drain cells are formed so that the drain cells are provided in contact with one of the long sides and one of short sides of adjoining body regions is in contact with one of the short sides.

By having this structure, corners of the body regions, which have the difficulty in functioning effectively as part of the channel width, are shaved so that the corners are rounded and adjoining body regions border on those parts, thereby, the number of cells (body regions and drain cells) has been increased to make larger the gate width of per unit area. As a result, a semiconductor device can be gained which has a lateral double diffusion MOSFET with a smaller operating resistance.

As the long sides are formed to have equal lengths and the short sides are formed to have equal lengths, respectively, and the body regions and the drain cells are arranged alternately to be in a matrix, they can be more effectively arranged.

By having the semiconductor layer of the first conductivity type working as the drain region which is a semiconductor layer formed by epitaxial growth on a semiconductor substrate of the second conductivity type, it becomes easier to form an IC integrated with other circuit elements, and by having a buried layer of a high density purity of the first conductivity type which is provided on the interface between the semiconductor substrate under the body regions and the semiconductor layer of the first conductivity type, it has become easy to lower the resistance of the entire device.

And it is preferable for the source regions being provided along the outer periphery of the body regions in a ring form, and a high density impurity region of the second conductivity type being formed in the central part of the ring form. By this structure, the electric potential of the body regions becomes equal to that of the source regions to stabilize the threshold voltage $V_{th}$ of DMOS, and to prevent a parasitic npn transistor from operating.

DETAILED DESCRIPTION

Figure 1:
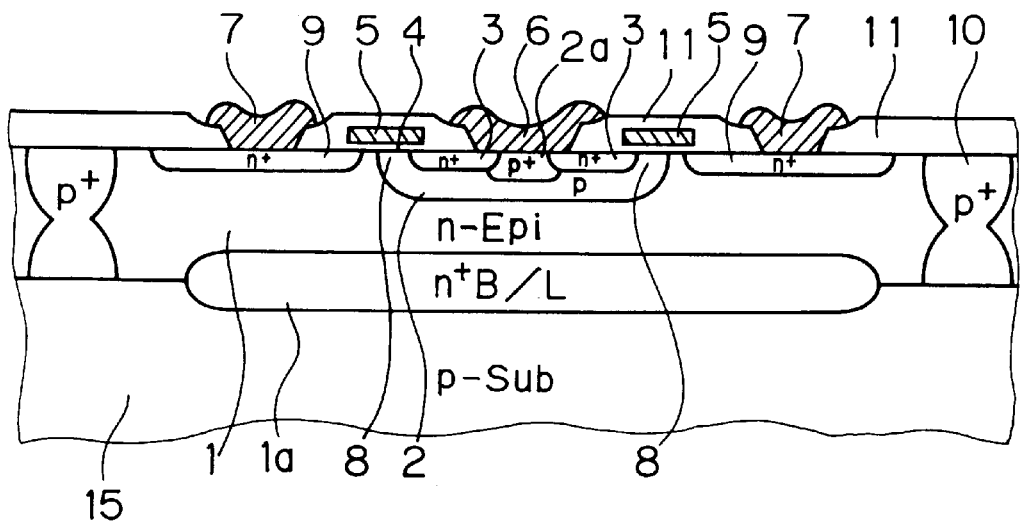
FIG. 1 illustrates a sectional view of a lateral type DMOSFET which is one embodiment of a semiconductor device according to the present invention.
Figure 2:
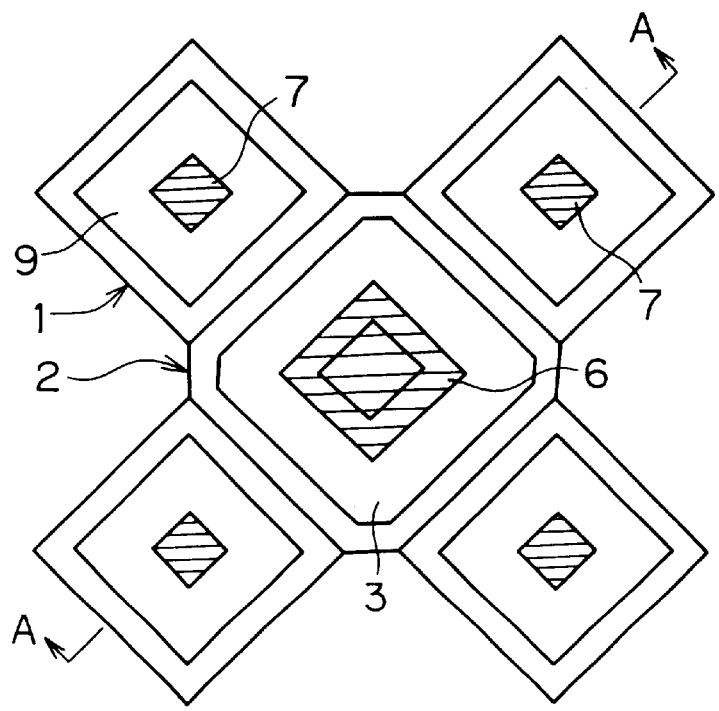
FIG. 2 illustrates a plan view of the lateral type DMOSFET shown in FIG. 1.
Figure 3A:
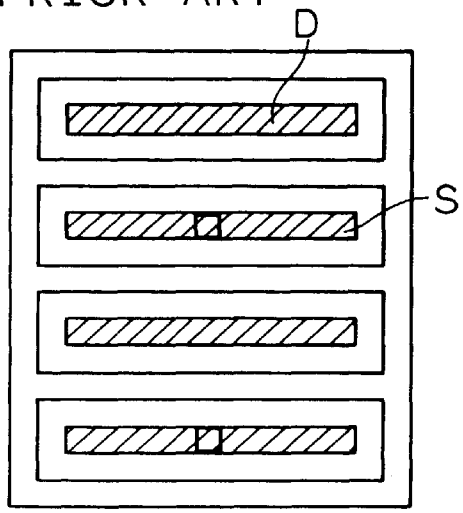
FIG. 3 illustrates plan views of gate patterns of DMOSFET's according to a prior art.
Figure 3B:
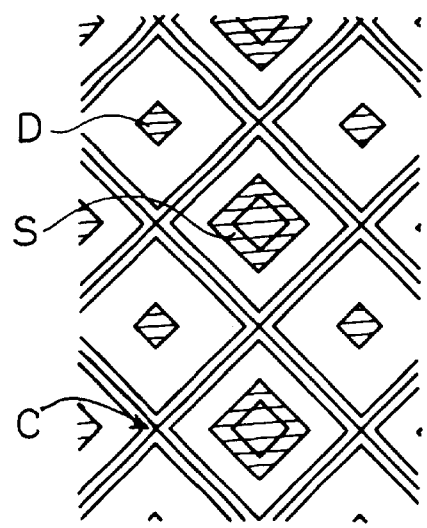
Figure 3C:
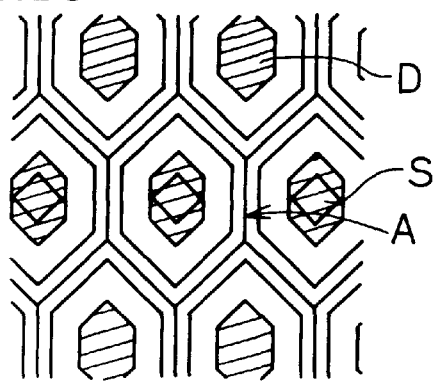
Figure 3D:
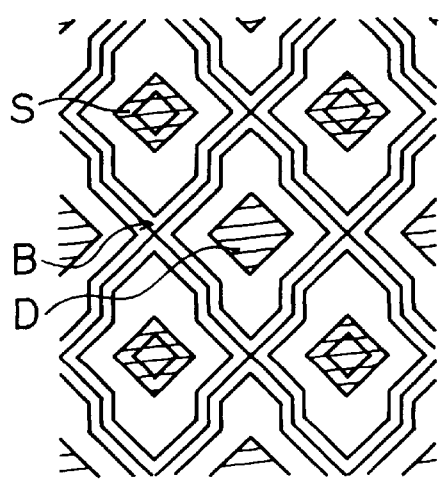
Figure 3E:
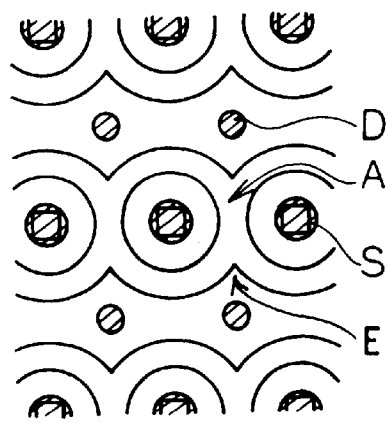

In a semiconductor device according to the present invention, a plurality of body regions 2 formed from diffusion regions of a second conductivity type (e.g. p-type) are formed regularly on the surface of a semiconductor layer of a first conductivity type (e.g. n-type) working as a drain region (drain cell) 1 such that a sectional view of one example of a lateral type double diffusion MOSFET which is one example of the invention is shown in FIG. 1. And an n-type source region (source cell) 3 is formed within the periphery of each of the body regions 2 with a certain interval from the periphery, and a gate electrode 5 is provided through a gate oxide film 4 on the surface of a channel region 8 between the source region 3 and the drain region 1, and an n$^+$-type contact region 9 for a drain electrode 7 is provided onto the drain cell 1 surrounded by said pluralities of body regions 2. And as a plan view of the source and drain cell pattern is illustrated in FIG. 2, the device is characterized by having a lateral type double diffusion MOSFET of which body regions 2 (source cells 3) are formed in an octagonal shape on the plane, and of which drain cells 1 are formed in a quadrilateral on the plane. In FIGS. 1 and 2, the numeral 6 denotes a source electrode, the numeral 10 denotes a p$^+$-type isolation, the numeral 11 denotes an interlayer isolation film, and a plurality of DMOS formed from the source cells 2 and the drain cells 1 between the isolations 10 so that a power MOSFET is formed to cope with a heavy current, for the simplification in FIG. 1, however, only one source cell 2 and two drain cells 1 are shown. FIG. 1 is a cross sectional view taken alone a line A—A in FIG. 2.

As for a plane pattern of the body regions 2 and drain cells 1, as shown in FIG. 2, each of the body regions 2 has an octagonal shape formed from a quadrilateral on the plane of which four corners are eliminated to the c face shape, and the drain cells 1 are formed adjoining the longer sides of the octagonal body region 2, and a body region 2 is located between drain cells 1, which are formed regularly and continuously so that the shorter sides of the octagon adjoin the shorter sides of other body regions 2. That is to say, along the long sides of the octagon body regions 2 are arranged through the drain cells 1, and along the shorter sides of the octagon other body regions 2 are arranged so that their shorter sides are in contact directly, in a layout where a plurality of the body regions 2 and the drain cells 1 are arranged. To form such an layout, when impurity is diffused to form the body regions 2, the locations of the body regions 2 are defined by diffusing impurity through a mask formed in the pattern of the layout while each of the drain cells 1 is formed between them.

Except that the body regions 2 and the drain cells 1 are formed in the above mentioned pattern, the semiconductor device has the same structure as a conventional lateral type DMOS. That is to say, an n-type semiconductor layer as the drain region 1 is formed through an n$^+$-type buried region 1a on a p-type semiconductor substrate 15 by epitaxial growth of an n-type semiconductor layer 1. And by diffusing p-type impurity such as boron through the above mentioned pattern in the n-type semiconductor layer 1, the body regions 2 are formed. An n$^+$-type source regions (source cells) 3 are formed so that a certain interval is provided around the periphery of and on the surface of each of the body regions 2. Gate electrodes 5 of poly-silicon or the like are provided through a gate oxide film 4 covering a channel region 8 between a source regions 3 and the above mentioned drain region (drain cell) 1 at the end of each of those body regions 2. And an interlayer isolation film 11 formed of $Si_xO_y$ or $Si_xN_y$ is provided and a source electrode 6 is formed of Al or the like so as to be connected to the source region 3 through a contact hole. In addition, by forming a drain electrode 7 on the contact region 9 of the drain region 1, a lateral DMOS is formed as a transistor for controlling on and off by the gate electrode 5 through the gate oxide film 4 on the channel region 8. And in a part of the body region at the center of the source region 3, a p$^+$-type region 2a is formed for a back gate contact.

According to the present invention, the body regions 2 for forming channel regions are formed in an octagonal shape on the plane by eliminating the corners, and adjoining body parts 2 are provided so as to be in contact with those eliminated parts in order to be able to form the body regions 2 in high density. On the other hand, corners of the body regions 2 become non working regions with a wide gap between the source and the drain, therefore, they will not affect the characteristics of the device even though they are eliminated. That allows the body regions 2 to be provided densely by being in contact with each other through the eliminated corners, and the gate width per unit area has increased to 1.43 times as large as that of the conventional stripe type gate structure. As a result, the operating resistance $R_{on}$ can be reduced greatly. In addition, the corners of the body regions 2 become obtuse angles instead of the rectangles of a square, which eliminates the concentration of the electric fields and makes the device to be able to withstand the increased applied voltage of 100 V or more. Moreover, the structure of the side wall spacers or the like formed on the gate side walls has no remarkable difference between in the straight parts and in the corner parts. In addition, no locally longer part is generated in the distance between the source contacts and the gates, which can restrain the parasite npn transistors from operating. And because the form of the drain cells is a quadrilateral, no portion is pinched and no parts become higher locally than other parts in the drain resistance.

As described above, according to the present invention, the gate width per unit area can be greatly increased so that the operating resistance can be reduced. As a result, the device can be effectively utilized in the power ICs, motor drivers or the like applicable to portable apparatuses or the like that require a lower consumption power.

Although preferred example have been described in some detail it is to be understood that certain changes can be made by those skilled in the art without departing from the spirit and scope of the invention as defined by the appended claims.

What is claimed is:

1. A semiconductor device having a lateral type double diffusion MOSFET comprising:
   a semiconductor layer of a first conductivity type as a drain region;
   a plurality of body regions comprising a plurality of diffusion regions of a second conductivity type formed regularly on a surface of said semiconductor layer;
   source regions of said first conductivity type, each of which being formed within each of said plurality of body regions with a certain interval from the periphery;
   gate electrodes formed through an insulator film on the surface of channel regions between said source regions and said drain region; and
   drain cells, each of which being surrounded by some of said plurality of body regions and being provided with a contact region for an electrode,
   wherein said body regions being formed as an octagon on the plane, and said drain cells being formed as a quadrilateral on the plane.

2. The semiconductor device of claim 1, wherein said octagon of each of said body regions has long sides and short sides connected alternately on the plane, said short sides being formed by cutting off the corners of a quadrilateral, and said body regions and said drain cells are formed so that said drain cells are provided in contact with one of said long sides and one of short sides of adjoining body regions is in contact with one of said short sides.

3. The semiconductor device of claim 2, wherein said long sides are formed to have equal lengths and said short sides are formed to have equal lengths, respectively, and said body regions and said drain cells are arranged alternately to be in a matrix.

4. The semiconductor device of claim 1, wherein said semiconductor layer of the first conductivity type working as said drain region is a semiconductor layer formed by epitaxial growth on a semiconductor substrate of the second conductivity type.

5. The semiconductor device of claim 4, wherein a buried layer of a high density impurity of the first conductivity type is provided on the interface between said semiconductor substrate under said body regions and said semiconductor layer of the first conductivity type.

6. The semiconductor device of claim 1, wherein said source regions are provided along the outer periphery of said body regions in a ring form, and a high density impurity region of the second conductivity type is formed in the central part of said ring form.

* * * * *